US006978435B2

(12) United States Patent
Anderson et al.

(10) Patent No.: US 6,978,435 B2
(45) Date of Patent: Dec. 20, 2005

(54) APPARATUS FOR PROGRAMMING A PROGRAMMABLE DEVICE, AND METHOD

(75) Inventors: Howard C. Anderson, Tempe, AZ (US); Danny Austin Bersch, Gilbert, AZ (US); Ian Craig Macbeth, Alsager (GB); Christopher Robin Schene, Phoenix, AZ (US); Timothy James Streit, Mesa, AZ (US)

(73) Assignee: Anadigm, Inc., Tempe, AZ (US)

( * ) Notice: Subject to any disclaimer, the term of this patent is extended or adjusted under 35 U.S.C. 154(b) by 57 days.

(21) Appl. No.: 10/232,238

(22) Filed: Aug. 29, 2002

(65) Prior Publication Data

US 2004/0041175 A1 Mar. 4, 2004

(51) Int. Cl.$^7$ .............................................. G06F 17/50
(52) U.S. Cl. ........................................................ 716/17
(58) Field of Search ................ 716/17, 16; 395/500.18, 395/500.17, 500.02

(56) References Cited

U.S. PATENT DOCUMENTS

| | | | | |
|---|---|---|---|---|
| 5,418,728 A | * | 5/1995 | Yada ............................ | 700/97 |
| 5,787,012 A | * | 7/1998 | Levitt ............................ | 716/1 |
| 5,794,062 A | | 8/1998 | Baxter ...................... | 395/800.3 |

(Continued)

FOREIGN PATENT DOCUMENTS

WO   WO 95/32478   11/1995

OTHER PUBLICATIONS

U.S. Appl. No. 10/171,334, filed Jun. 11, 2002, Bersch et al.
Proceedings of Object–Oriented Simulation Conf; Howard C. Anderson; Int'l Conf. on Simulation and Multimedia in Engineering Education (ICSEE '98), San Diego, CA, pp. 235–238.
"Analoge Filterfunktionen in Reprogrammlerbaren ICs"; A. Auer; Elektronik Industrie Huthig Gemany; vol. 32, No. 10; 2001; pp. 24–29.

*Primary Examiner*—Vuthe Siek
*Assistant Examiner*—Sun James Lin
(74) *Attorney, Agent, or Firm*—Wells St. John P.S.

(57) ABSTRACT

An apparatus is provided for programming a programmable circuit device capable of realizing at least one sub-circuit by wiring together at least one circuit component. The programmable circuit device includes a programmable computing device, a user interface, and a design tool. The user interface is associated with the programmable computing device. The design tool is associated with the programmable computing device and is configured for interaction with a user at the user interface. The design tool includes computer program code embodied in the programmable computing device including a sub-circuit definition containing information for defining at least one of multiple configurations, topologies, and parameters of a sub-circuit of a programmable device. A method is also provided.

12 Claims, 7 Drawing Sheets

U.S. PATENT DOCUMENTS

| | | | |
|---|---|---|---|
| 5,838,165 A | 11/1998 | Chatter | 326/38 |
| 5,887,165 A | 3/1999 | Martel et al. | 395/653 |
| 5,931,959 A | 8/1999 | Kwiat | 714/48 |
| 5,959,871 A * | 9/1999 | Pierzchala et al. | 703/4 |
| 6,023,565 A * | 2/2000 | Lawman et al. | 716/1 |
| 6,058,469 A | 5/2000 | Baxter | 712/43 |
| 6,078,736 A | 6/2000 | Guccione | 395/500.17 |
| 6,091,263 A | 7/2000 | New et al. | 326/40 |
| 6,092,174 A | 7/2000 | Roussakov | 712/15 |
| 6,150,839 A | 11/2000 | New et al. | 326/40 |
| 6,182,206 B1 | 1/2001 | Baxter | 712/43 |
| 6,230,307 B1 | 5/2001 | Davis et al. | 716/16 |
| 6,260,139 B1 | 7/2001 | Alfke | 713/1 |
| 6,272,669 B1 * | 8/2001 | Anderson et al. | 716/16 |
| 6,288,566 B1 | 9/2001 | Hanrahan et al. | 326/38 |
| 6,304,101 B1 | 10/2001 | Nishihara | 326/41 |
| 6,308,311 B1 | 10/2001 | Carmichael et al. | 716/16 |
| 6,311,149 B1 | 10/2001 | Ryan et al. | 703/21 |
| 6,314,553 B1 | 11/2001 | Stevens et al. | 716/18 |
| 6,324,676 B1 | 11/2001 | Burnham et al. | 716/16 |
| 6,326,806 B1 | 12/2001 | Fallside et al. | 326/38 |
| 6,327,253 B1 | 12/2001 | Frink | 370/260 |
| 6,339,827 B1 | 1/2002 | Stokes et al. | 713/176 |
| 6,346,824 B1 | 2/2002 | New | 326/39 |
| 6,357,037 B1 | 3/2002 | Burnham et al. | 716/17 |
| 2002/0199110 A1 * | 12/2002 | Kean | 713/189 |
| 2003/0097246 A1 * | 5/2003 | Hara et al. | 703/14 |

* cited by examiner

APPARATUS FOR PROGRAMMING A PROGRAMMABLE DEVICE, AND METHOD

TECHNICAL FIELD

This invention pertains to configurable devices. More particularly, this invention relates to the programming of a programmable device having circuit components configurable into sub-circuits and circuits, such as analog circuit components.

CROSS-REFERENCE TO COMPUTER PROGRAM LISTING APPENDIX

CD-ROM Appendix A, which is part of the present disclosure, is a CD-ROM appendix consisting of one (1) file. CD-ROM Appendix A is a computer program listing appendix that includes a software program. Appendix A is incorporated herein by reference. The total number of CD-ROMs including duplicates is two (2), each of which includes one (1) file, as follows:

| Name | Size | Created |
|---|---|---|
| GAINHALF | 32,361 | Dec. 1, 2000 |

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

Configurable devices have recently become popular to address circuit design problems. One example of a configurable device is a programmable device having circuit components that can be configured into sub-circuits and circuits. One example of a configurable device is a field programmable analog array (FPAA).

A field programmable analog array (FPAA) consists of a collection of analog circuit components and switches. In order to realize a particular circuit design, the switches can be used to connect together components. The switches are also used to set values of individual analog circuit components. A binary bit stream can be downloaded to an FPAA in order to set the FPAA's switches, which in turn defines a particular circuit. However, even modestly sized FPAAs have thousands of switches that need to be set. Accordingly, there is a need for a technique to simplify the circuit design and switch-setting problem. Additionally, there is a need for an improved technique for simulating particular analog circuit designs.

For example, field programmable gate arrays (FPGAs) include a collection of digital circuit components and a collection of switches that may be used to connect the digital components together in order to realize various sub-circuits and circuits. However, the design and connection of analog components within a field programmable analog array (FPAA) differs significantly from the design and connection of digital components within a field programmable gate array (FPGA). First, digital design software tools do not readily adapt to use in the analog domain. Secondly, analog components often have adjustable values, such as gain, frequency, resistance, etc., but digital components do not. Thirdly, simulators used with field programmable gate arrays (FPGAs) are typically digital logic simulators that do not apply to analog circuits.

According to previously known techniques, full custom integrated circuit design was relatively time-consuming and required extensive analog design expertise. Programmable devices and FPAAs, in particular, provide the ability to quickly produce and change circuits when given the proper data to program the array. However, this provision requires the generation of custom programming data, which is complicated and requires an intimate knowledge of both array architecture and design of circuits using the technology that the array is built upon.

For the case where a microprocessor provided adjacent to an FPAA is required to change aspects of the circuit function implemented by the FPAA, a circuit designer has needed an intimate knowledge of array architecture, the design of circuits using the technology on which the FPAA has been built, and the construction of the specific data sequences to cause the FPAA to realize such circuits.

Hence, the above-described technique involves the generation of custom programming data that is very labor-intensive and so complex as to be difficult to implement. Accordingly, improvements are needed to overcome this problem.

Accordingly, improvements are also needed in order to enable programming of a programmable device that includes analog components.

SUMMARY OF THE INVENTION

An apparatus and method are provided for designing a circuit by assembling together a group of sub-circuits within a computer-aided design (CAD) tool. The CAD tool enables translation of a circuit design into properly formatted data that is needed to program a programmable device in which the circuit is realized.

According to one aspect, an apparatus is provided for programming a programmable circuit device capable of realizing at least one sub-circuit by wiring together at least one circuit component. The programmable circuit device includes a programmable computing device, a user interface, and a design tool. The user interface is associated with the programmable computing device. The design tool is associated with the programmable computing device and is configured for interaction with a user at the user interface. The design tool includes computer program code embodied in the programmable computing device including a sub-circuit definition containing information for defining at least one of multiple configurations, topologies, and parameters of a sub-circuit of a programmable device.

According to another aspect, an apparatus is provided for programming a programmable device. The apparatus includes a programmable computer, a user interface, and a computer program code. The user interface is associated with the programmable computer. The computer program code is embodied in the programmable computer, and includes at least one sub-circuit definition. The at least one sub-circuit definition includes information about a sub-circuit of a programmable device usable to define multiple values for at least one parameter of the sub-circuit responsive to user input at the user interface for wiring together circuit components to realize a sub-circuit in the programmable device.

According to yet another aspect, a method is provided for programming a programmable circuit device. The method includes: providing a programmable computer with a design tool and sub-circuit definitions for circuit components; and with the programmable computer, generating a circuit design that wires together circuit components to realize a sub-circuit within a programmable circuit device.

According to yet even another aspect, an apparatus is provided for programming a programmable device having circuit components capable of being configured into a circuit. The apparatus includes a programmable computer and computer program code. The computer program code is embodied in the programmable computer including at least one sub-circuit definition. The sub-circuit definition includes information for wiring together sub-circuit components of a programmable device into a circuit design. The sub-circuit definition is usable to define unique multiple configurations of the sub-circuit.

According to even yet another aspect, a method is provided for configuring together circuit components to enable realization of a circuit in a programmable analog array (FPAA). The method includes: programming a programmable computer with instructions comprising sub-circuit definitions that enable a user via a user interface of the programmable computer to define a configuration of circuit components to realize a sub-circuit in an FPAA; and via a user interface, defining a specific configuration of circuit components that will realize a sub-circuit in an FPAA.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
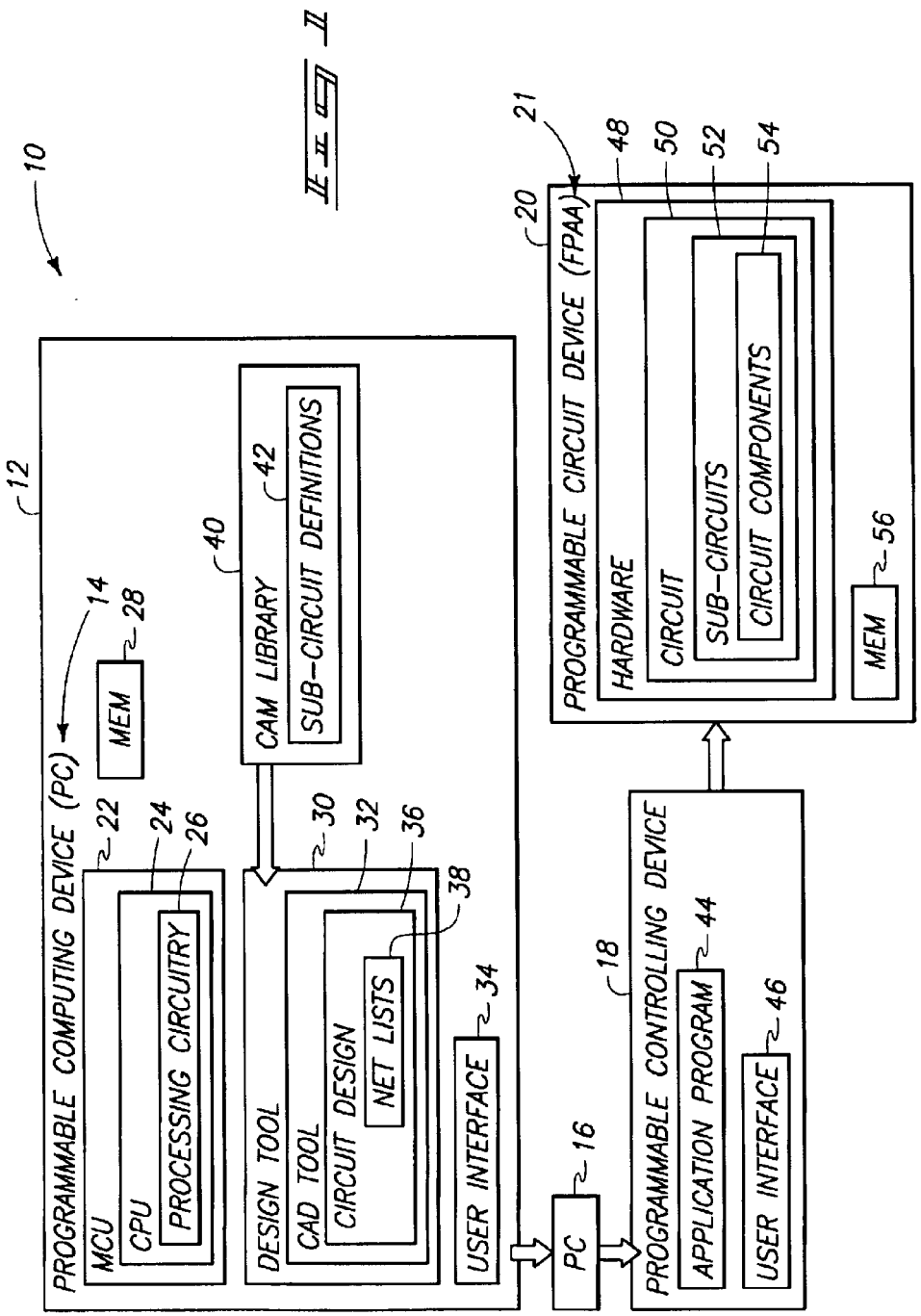
FIG. 1 illustrates a block diagram overview of a basic system configuration of an exemplary system for programming a programmable device, according to one embodiment of the present invention.

This disclosure of the invention is submitted in furtherance of the constitutional purposes of the U.S. Patent Laws "to promote the progress of science and useful arts" (Article 1, Section 8).

Reference will now be made to a preferred embodiment of Applicants' invention. One exemplary implementation is described below and depicted with reference to the drawings comprising a system and method for programming a programmable circuit device. While the invention is described by way of a preferred embodiment, it is understood that the description is not intended to limit the invention to such embodiment, but is intended to cover alternatives, equivalents, and modifications which may be broader than the embodiment, but which are included within the scope of the appended claims.

In an effort to prevent obscuring the invention at hand, only details germane to implementing the invention will be described in great detail, with presently understood peripheral details being incorporated by reference, as needed, as being presently understood in the art.

For purposes of this disclosure, the term "sub-circuit" is understood to refer to a network of connected components available for use as a macro-component of a larger circuit. A sub-circuit can form part of a circuit, or an entire circuit. A circuit might contain multiple connected sub-circuits. For example, a superheterodyne receiver circuit comprises a radio-frequency (RF) amplifier sub-circuit, an oscillator sub-circuit, a mixer sub-circuit, an intermediate frequency (IF) amplifier sub-circuit, a detector sub-circuit, an audio amplifier sub-circuit, and a power supply sub-circuit that are connected together to form a complete superheterodyne receiver circuit.

For purposes of this disclosure, the term "field programmable analog array (FPAA)" is understood to refer to an integrated circuit capable of being programmed and configured to implement analog circuits using programmable interconnections and an array of configurable analog blocks. More particularly, an FPAA includes a collection of analog circuit components and switches. The switches are used to connect the components together in order to realize a particular circuit design. Switches are also used in order to set values of individual analog circuit components. By downloading a binary bitstream to the programmable device, or FPAA, the switches can be set in order to program the device, which in turn defines a particular circuit or sub-circuit on the device. Even relatively simple FPAAs have thousands of switches that need to be set in order to realize a particular circuit design. Accordingly, improvements presented herein are employed in order to simplify the circuit design and switch setting problem. Furthermore, provision is made for simulating particular analog circuit designs using improvements also presented herein.

For purposes of this disclosure, the term "C" code as used herein refers to a specific example of program code. It is understood that other specific program codes could also be used including PASCAL, Visual Basic, Fortran, as well as other known program codes.

FIG. 1 illustrates a preferred embodiment of Applicants' invention wherein a basic system configuration is provided for programming a programmable circuit device, and is identified with reference numeral 10. System 10 includes a programmable computing device 12, such as a personal computer (PC) 14.

As shown in FIG. 1, system 10 is implemented in a combination of software and hardware in a manner that enables programming of programmable circuit device 20 using programmable controlling device 18. More particularly, software is provided in the form of exported device information for programming programmable circuit device 20 so that information that is required for close coupled control is made available for use in developing a controller program via a central processing unit (CPU)

program. Programmable controlling device 18 then makes modified configuration data available to programmable circuit device 20 either by (a) modifying all or part of the configuration data, and then applying the configuration data to the registers within the programmable circuit device 20, or (b) directly modifying all or part of the configuration data contained within the registers of the programmable circuit device 20. Using configuration data, programmable circuit device 20 is programmed as a consequence of the software. Software aspects of the system generate, in addition to usual configuration data of prior art systems, code which may be used by a second configurable device in order to modify, in whole or in part, functionality of programmable circuit device 20.

As shown in FIG. 1, programmable computing device 12 in one form comprises a personal computer (PC) 14. PC 14 includes a micro-controller unit (MCU) 22, memory 28, a design tool 30, a user interface 34, and a configurable analog module (CAM) library 40. MCU 22 includes a central processing unit (CPU) 24 that includes processing circuitry 26. Design tool 30 includes a computer-aided design (CAD) tool 32 in which one or more circuit designs 36 are generated and modeled. Each circuit design 36 includes circuit model information in the form of netlists 38.

CAM library 40 includes a plurality of sub-circuit definitions 42 that contain information about respective sub-circuits. In one case, a sub-circuit definition is a configurable analog module (CAM). Accordingly, CAM library 40 comprises a plurality of CAMs. Programmable controlling device 18 includes an application program 44 and a user interface 46. In operation, application program 44 includes computer program code for implementing software monitoring and control functions within the associated application system. User interface 46 enables such monitoring and control functionality.

Programmable circuit device 20, in one form, comprises a field programmable analog array (FPAA) 21. FPAA 21 includes hardware 48 and memory 56. Hardware 48 is configurable via programming into multiple unique configurations. More particularly, a circuit 50 is realized within FPAA 21 by wiring or connecting together sub-circuits 52 and circuit components 54 into a desired configuration.

Design tool 30 comprises AnadigmDesigner2. An earlier version, AnadigmDesigner, is presently publicly available for download and use at http://www.anadigm.com from Anadigm Ltd., United Kingdom, and is herein incorporated by reference. A future release version will include aspects of the present invention which are added to the above-referenced earlier version of AnadigmDesigner, details of which are described below.

According to such techniques, the generation of programming data is greatly simplified using computer-aided design (CAD) tools. CAD tools represent the design in a manner that is familiar to a circuit designer, and which automatically generates corresponding data needed to program an FPAA. The ability to modify or generate such programming in the absence of such computer aided design tools is limited, and almost prohibitive.

In operation, an initial set of configuration data is generated by design tool 30. Configuration data is provided via exported device information to a compiler (not shown) within PC 16. Additionally, or optionally, configuration data is provided via a user program (not shown) of PC 16 to the compiler. Further details of methods for configuring a programmable semiconductor device are disclosed in U.S. Pat. No. 6,272,669 B1, entitled "Method for Configuring a Programmable Semiconductor Device", herein incorporated by reference. Additional details of an apparatus and method for configuring analog elements in a configurable hardware device are disclosed in U.S. patent application Ser. No. 10/171,334, entitled "System and Method for Configuring Analog Elements in a Configurable Hardware Device", herein incorporated by reference.

The specific improvements added to AnadigmDesigner2 over those presently available in publicly usable and commercially available AnadigmDesigner includes the ability to design a circuit by assembling together a group of sub-circuit designs in a CAD tool. Once designed, the circuit (or sub-circuit) design can be realized in a programmable device, such as a field programmable analog array (FPAA). The CAD tool provides a mechanism for translating the circuit design into properly formatted data needed to program the device. Sub-circuit definitions for respective sub-circuits are compatible with the CAD tool, but are not an integral part of the CAD tool. The sub-circuit definitions are portable individually or in groups. More particularly, the sub-circuit definitions do not need to be compiled in order to use them with the CAD tool. Hence, the sub-circuit definitions can easily be created or modified to change functionality of the associated sub-circuit while still maintaining compatibility with the CAD tool.

The sub-circuit definitions contain information about the sub-circuit needed to do several things. First, they contain information about the sub-circuit needed to define multiple configurations, topologies, and parameters of the sub-circuit. Secondly, the sub-circuit definitions contain information about the sub-circuit needed to define and control the user interface that allows control of these multiple configurations. Thirdly, they contain information about the sub-circuit needed to modify the configuration of the sub-circuit based on user selections. Fourth, they contain information about the sub-circuit needed to provide error checking regarding the correct use of the sub-circuit. Fifth, they contain information about the sub-circuit needed to simulate the sub-circuit behavior within a larger analog circuit. Sixth, they contain information about the sub-circuit needed to draw a symbolic representation of the sub-circuit. Seventh, they contain information about the sub-circuit needed to determine the version number of the sub-circuit. Eighth, they contain information about the sub-circuit needed to determine the sub-circuit's compatibility with a particular CAD tool or version of a particular CAD tool. Ninth, they contain information about the sub-circuit needed to determine the sub-circuit's compatibility with a programmable device, such as an FPAA.

Some of the information about the sub-circuit is contained in the form of algorithms which may be realized in interpreter code. When the information in the algorithms is combined with data stored in the CAD tool and data taken from user interfaces run by the CAD tool, the algorithms return the desired information to the CAD tool. For example, information about modifying the configurations of the sub-circuit in response to user selections (item three, above) is handled in this manner.

CAD tool 32 (of FIG. 1) has the ability to do several things. First, it can read data contained in the sub-circuit definitions. Secondly, it can provide a user interface wherein the user can assemble the sub-circuits into larger circuits. Thirdly, it can provide a user interface for each sub-circuit so that a user can change the configuration and behavior of that sub-circuit design. Fourth, it can run interpreter code contained in the sub-circuit definitions. Fifth, it can provide a user interface with functionality that is specific to a particular programmable device. Sixth, it can set up and run a simulation using the circuit design and information contained in the sub-circuit definitions. Seventh, it can view the results of a simulation. Eighth, it can transform the circuit design into properly formatted data to download to a programmable device. Ninth, it can facilitate download of the properly formatted data to a programmable device.

The present implementation allows significant design expertise to be contained within the sub-circuit definitions, including sub-circuit topology, the relationship of sub-circuit topology and component values to higher level parameters displayed by the user interface, and sub-circuit performance as shown through simulation. The sub-circuit definitions, together with the CAD tool, contain specific details of the programmable device architecture. Accordingly, it is not required that a person utilizing this technique be an expert in circuit design or the programmable device. Instead, the user can work in a higher level of abstraction represented by the user interfaces of the sub-circuits and CAD tool. Hence, the design of circuits and the translation of circuits to a proper format for programming an FPAA chip is both relatively quick and easy.

Sub-circuit definitions, in the form of a configurable analog module (CAM), comprise a fully self-contained definition of one or more sub-circuits (or circuits) which can be configured in a programmable device, such as an FPAA chip. A sub-circuit definition includes "C" code that forms an integrated part of the sub-circuit definition, and interacts intimately with other sub-circuits. A CAM includes "snippets", or relatively small segments, of "C" code which define configuration, as well as a simulation model.

FIGS. 2–7 illustrate one possible implementation of the present invention. However, it is understood that other implementations having wider applicability are also possible and fall within the scope of the appended claims.

Figure 2:
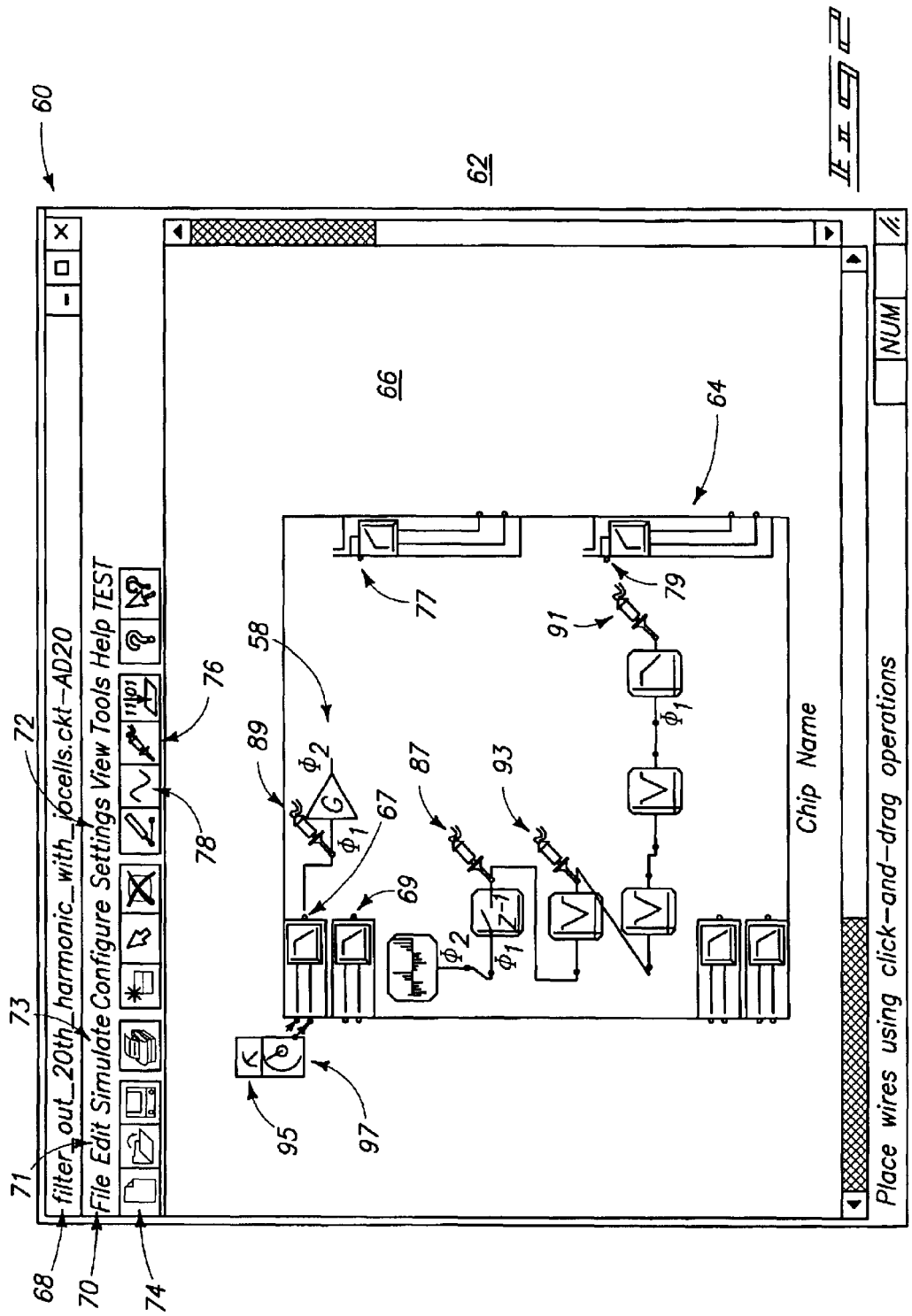
FIG. 2 is a diagram of a screen display for the design tool application window of FIG. 1 and illustrating a half-cycle gain stage.

FIG. 2 illustrates set-up of specific analog circuitry (or sub-circuitry) that will realize a half-cycle gain stage 58 within AnadigmDesigner2. By starting the application of AnadigmDesigner2, a user is presented with the screen display 60 depicted in FIG. 2 within a design tool application window 62. An AN220E04 FPAA chip design 64 is provided within work space 66 to enable construction of a specific chip design.

Screen display 60 includes a header 68, a menu bar 70 in which a plurality of menu items 71–73 are displayed for selection by a user, and a tool bar 74 in which a plurality of selectable tool bar buttons 76 and 78 are provided.

With the exception of specific menu items for "Edit", "Simulate", "Configure", and "Settings" depicted in FIG. 2, the remaining menu items of menu bar 70 are presently available in AnadigmDesigner, an earlier version of AnadigmDesigner2. Accordingly, the functional details of such other menu items are not discussed herein in great detail in order to prevent obscuring the invention at hand. Instead, the added functionality and details provided by the "Edit" and "Simulate" menu items 71 and 73 will be discussed in greater detail below.

Chip design 64 provides an initial template in which a specific chip design is generated using AnadigmDesigner2. More particularly, chip design 64 includes a plurality of input cells, such as input cells 67 and 69, as well as a plurality of output cells, such as output cells 77 and 79.

According to the present implementation, a sub-circuit definition comprises a configurable analog module (CAM) present within a CAM library of the CAD tool. According to one implementation, a CAM is a single text file containing all the information needed to define a particular sub-circuit corresponding to the sub-circuit description. The half-cycle gain stage 58 of FIG. 2 provides one example of a CAM.

As shown in FIG. 2, a pair of signal generators 95 and 97 have been applied to input leads on input cell 67. Each signal generator 95 and 97 is generated by selecting tool bar button 78 which launches the icon for signal generators 95 and 97 which is then placed via a mouse and cursor at the desired input pin. By right clicking to select the icon for signal generators 95 or 97, a menu item is generated. The selected menu item is then displayed, entitled "Signal Generator Settings". Selection of such menu item launches screen display 124 of FIG. 4; namely, a signal generator control dialog box 125 (of FIG. 4).

Additionally, a plurality of oscilloscope probes 87, 89, 91, and 93 are applied at selected locations within the sub-circuit design by selecting tool bar button 76 which generates a movable oscilloscope icon that can be positioned and placed via a computer mouse and cursor by left clicking on the mouse once the cursor has been placed at the appropriate node. Once placed, a user can right click on the oscilloscope probe icon 87, 89, 91, or 93 which launches a menu including a "Oscilloscope" menu item. Selection of the menu via a mouse and cursor launches the oscilloscope dialog box 157 of FIG. 5.

Screen display 60 enables a user to render user-selected options that are used with interpreter code to determine the proper configuration of the corresponding "half-cycle gain stage" sub-circuit. The configuration is specified by one of the netlists contained in the corresponding CAM. Each netlist includes references to capacitors, operational amplifiers (op amps), and other analog components that exist on the FPAA, or chip. The netlists also contain connectivity information that shows how these components need to be connected in order to realize the user-selected configuration of the "half-cycle gain stage".

Figure 3:
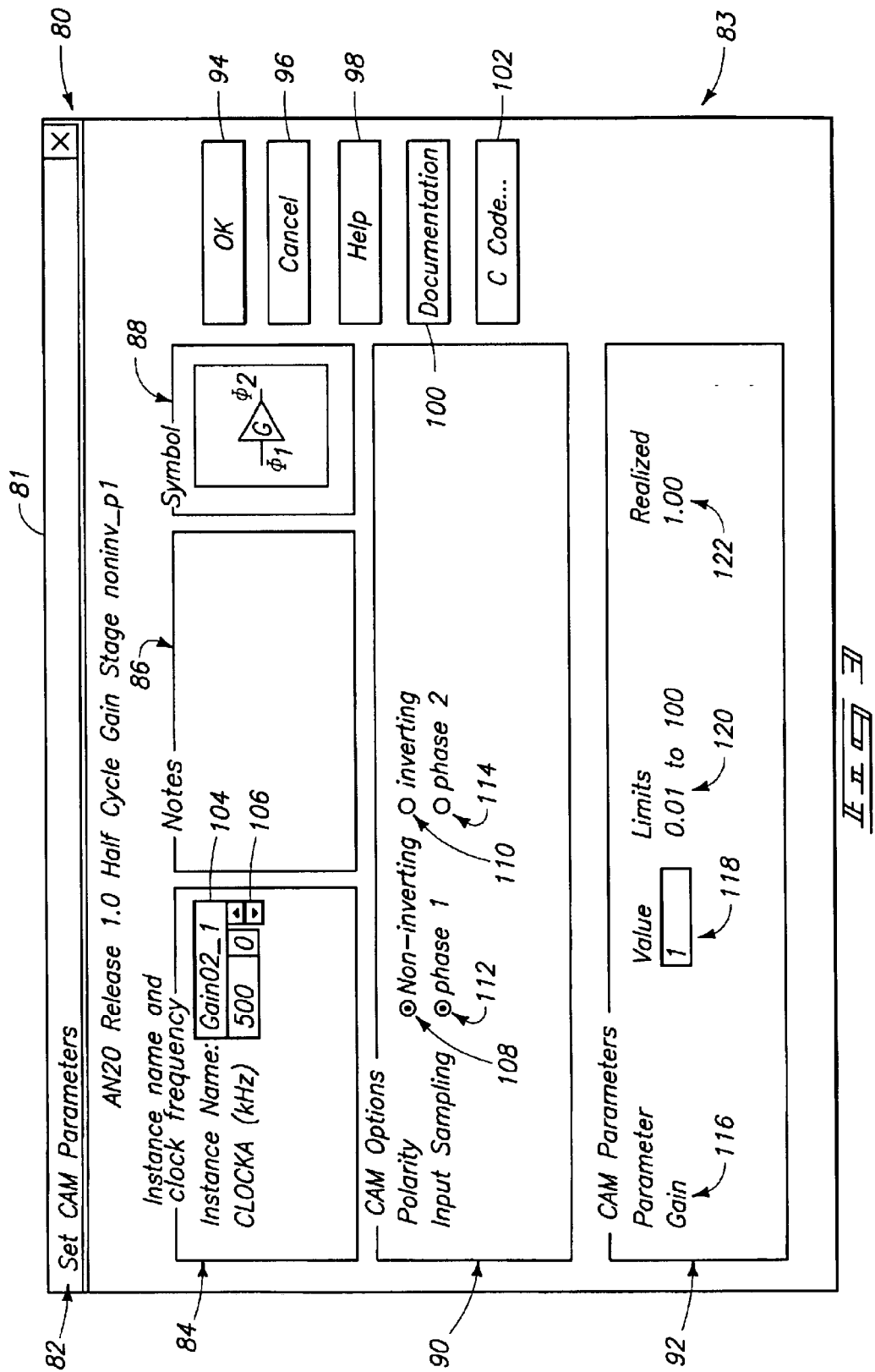
FIG. 3 is a diagram of a "Set CAM Module Parameters" dialog box that comprises a user interface in the form of a pop-up window within the screen display of FIG. 2.

More particularly, FIG. 3 illustrates a screen display 80 for a CAM parameters dialog box 81 for the half-cycle gain stage 58 (of FIG. 2). A user navigates to screen display 80 by selecting "Edit" button 71 (of FIG. 2), then selecting "Insert New CAM" (not shown) from a pull-down menu that extends from "Edit" button 71. A "Select CAM" dialog box is then displayed (not shown), and a user merely selects one of a plurality of CAMs from a scroll-down list clicks an "OK" button in order to launch the corresponding display screen 80 and user interface 83 for the half-cycle gain stage CAM description of FIG. 3.

As shown in FIG. 3, a CAM contains information that is used to set up a "Set CAM Parameters" dialog box 81 that provides a user interface 83. User interface 83 for the half-cycle gain stage CAM of FIG. 2 contains various options that allow a user to adjust characteristics of the resulting sub-circuit based upon the sub-circuit definition.

User interface 83 includes a header 82 describing the function of dialog box 81 to "Set CAM Parameters". User interface 83 also includes an "Instance name and clock frequency" field 84, a "Notes" field 86, a "Symbol" field 88, a "CAM Options" field 90, and a "CAM Parameters" field 92. User interface 83 further includes an "OK" button 94, a "Cancel" button 96, a "Help" button 98, and an "MCU Code" button 100.

"Instance name and clock frequency" field 84 includes an "Instance Name" descriptor box 104 and "clock frequency" scrolling list box 106. An instance name shown in descriptor box 104 identifies the name of the sub-circuit being configured by the sub-circuit definition. "Clock frequency" scrolling list box 106 enables a user to selectively configure the clock frequency for the sub-circuit of the respective CAM identified in dialog box 81 and represented by Symbol 88.

"Notes" field 86 includes information pertaining to the sub-circuit being configured via the sub-circuit definition that corresponds with the CAM associated with the dialog box 81. For example, a specific circuit characteristic can be textually displayed in "Notes" field 86.

"Symbol" field 88 includes a graphic depiction of the sub-circuit that is identified by a respective CAM and configured via an associated sub-circuit definition via dialog box 81. As shown in FIG. 3, a half-cycle gain stage circuit representation is displayed in "Symbol" field 88.

"CAM Options" field 90 includes "Polarity" radio buttons 108 and 110 and "Input Sampling" radio buttons 112 and 114 that enable a user to further tailor configuration of the sub-circuit description for a resulting sub-circuit design as identified within dialog box 81 via user interface 83. For example, a user can select whether a resulting half-cycle gain stage sub-circuit is noninverting or inverting, via alternating selection of radio buttons 108 and 110. Additionally, the input sampling phase can be selected via alternate selection of "phase 1" radio button 112 and "phase 2" radio button 114.

"CAM Parameters" field 92 includes a "Parameter" descriptor field 116 identifying "Gain" as a parameter, a "Value" entry field 118, a "Limits" range field 120, and a "Realized" descriptor field 122. As shown in FIG. 3, field 92 includes "Gain" in a "Parameter" descriptor field 116 having a "Value" of "1" in field 118, with a "Limit" range of 0.01 to 100 in field 120, and a "Realized" value of 1.00 shown in field 122.

"OK" button 94 enables a user to selectively accept the configuration options that have been selected or entered via dialog box 81. "Cancel" button 96 enables a user to cancel the configuration options that are currently displayed, but not accepted, via dialog box 81. "Help" button 98 launches a help menu for the user, providing usage and navigational help with respect to using dialog box 81. Finally, "C Code" button 102 brings up a new window that enables a user to select functions that can be used with a microprocessor to dynamically update the FPAA when using the microprocessor.

The "Half-cycle Gain Stage" configurable analog module (CAM) of FIG. 3 in Appendix A also includes information that may be used in order to allow a user to set various parameters for the corresponding circuit (or sub-circuit), such as gain and polarity for the Half-cycle Gain Stage. FIG. 3 illustrates dialog box 81 within screen display 80 which is created from information contained in the CAM of Appendix A. The example "Half-cycle Gain Stage" CAM is as shown in Appendix A including CAM file contents that are used to create the dialog box 81 of FIG. 3. The Half-cycle Gain Stage CAM that is illustrated by the dialog box 81 of FIG. 3 also contains equations that may be used to calculate values for analog components within a field programmable analog array (FPAA), or chip, based on values provided by a user. For example, gain is determined by the ratio of the values of two capacitors. It is merely required that a user simply enter a value for gain, then equations within the CAM are interpreted in order to calculate appropriate values for the two capacitors in order to arrive at a ratio that realizes or determines the desired gain.

Additionally, the CAM of Appendix A (in FIG. 3) contains equations in "C" code form that may be used in order to simulate the behavior of a CAM when it is used in a circuit design. These equations may be used in a "C" interpreter when a simulation is being run.

The CAM also includes bitmap information and additionally, or alternatively, line-drawing information that is capable of being displayed. The CAM may also include multiple bitmaps and optionally, or additionally, line-drawings corresponding to different configurations of the CAM sub-circuit.

With reference back to FIG. 1, CAD tool 32 comprises AnadigmDesigner configured for use with AN20 series FPAAs (or chips). CAMs, as defined above, may then be read into CAD tool 32 under user control. The purpose of CAD tool 32 is to allow a user to select CAMs, choose configurations for the CAMs, set parameters for the CAMs (such as gain or frequency), place the CAMs on the computer screen, move the CAMs about the computer screen, attach "wires" to contacts within the circuitry corresponding to the CAMs, wire circuit elements together in the circuit design in order to make a more complex circuit, simulate the circuit, view the results of a simulation, create a bitstream that will implement the circuit when it is downloaded to an FPAA (or chip), and actually download the bitstream to the FPAA (or chip) so that the circuit can be tested.

Figure 4:
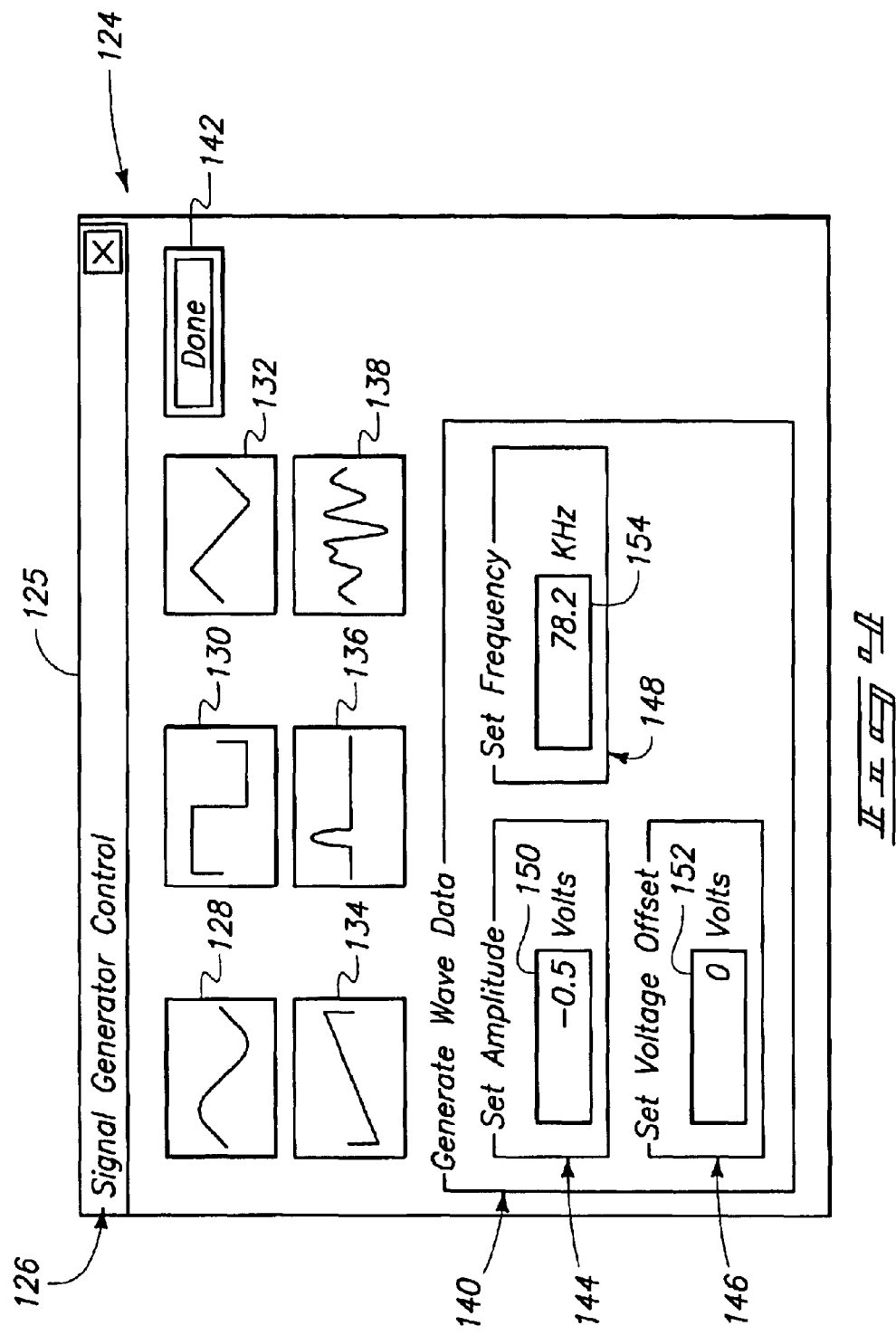
FIG. 4 is a diagram of a signal generator control dialog box that comprises a pop-up window within the screen display of FIG. 2.

FIG. 4 illustrates a screen display 124 for a "Signal Generator Control" dialog box 125. Dialog box 125 includes a "Signal Generator Control" header 126, waveform buttons 128, 130, 132, 134, 136, and 138, "Generate Wave Data" field 140, and "Done" button 142. Buttons 128, 130, 132, 134, 136, and 138 are alternately selected in order to configure a desired signal generator to generate a corresponding signal at the designated pin or cell where a signal generator 95 or 97 (of FIG. 2) has been placed via selection of signal generator button 78 (of FIG. 2).

For example, selection of waveform button 128 configures the signal generator to apply a sine wave at a selected pin. Selection of waveform button 130 configures the signal generator to apply a square wave. Selection of waveform button 132 configures the signal generator to apply a triangle wave. Selection of waveform button 134 configures the signal generator to apply a sawtooth wave. Selection of waveform button 136 configures the signal generator to apply a Dirac impulse. Finally, selection of waveform button 138 configures the signal generator to apply an arbitrary wave.

"Generate Wave Data" field 140 includes a "Set Amplitude" field 144, a "Set Voltage Offset" field 146, and a "Set Frequency" field 148. "Set Amplitude" field 144 includes a "Volts" entry field 150 for entering a voltage amplitude for the selected signal for the signal generator. "Set Voltage Offset" field 146 includes a "Volts" entry field 152 which enables a user to set a voltage offset for the selected signal for the signal generator. "Set Frequency" field 148 includes a "Volts" entry field 154 which enables a user to set a frequency for the selected signal for the signal generator.

Figure 5:
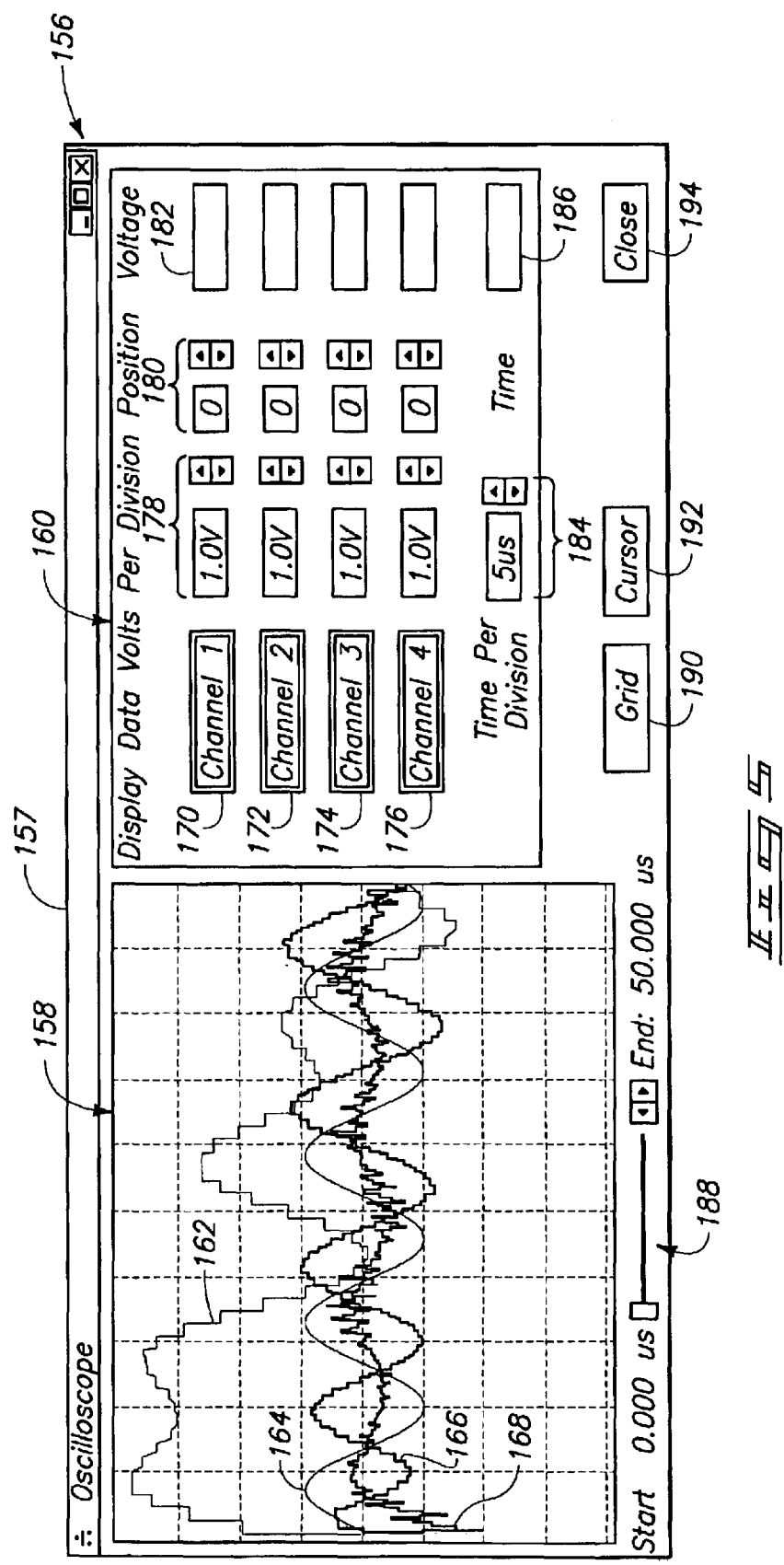
FIG. 5 is a diagram of an oscilloscope dialog box that comprises a pop-up window within the screen display of FIG. 2.

FIG. 5 illustrates a screen display 156 for an "Oscilloscope" dialog box 157. Selection of "Oscilloscope" button 78 (of FIG. 2) generates a movable oscilloscope icon that can be positioned and placed via a mouse cursor at a specific location within the chip design 64 (of FIG. 2). By clicking on the mouse cursor once the icon has been placed at an appropriate node, a user can then right click on the oscilloscope probe icon 87 (see FIG. 2), which launches a menu that includes an "Oscilloscope" menu item. Selection of the "Oscilloscope" menu item via using a mouse cursor launches the oscilloscope dialog box 157 of FIG. 5.

Accordingly, "oscilloscope" dialog box 157 includes a signal output display field 158 in which a time-domain output 162, 164, 166, and 168 is displayed for channels 1–4, corresponding with channels identified by "Channel Selection" boxes 170, 172, 174, and 176. By way of example, oscilloscope output waveform 162 corresponds with an oscilloscope output identified by oscilloscope probe icon 87 (of FIG. 2), corresponding with "channel 1". Similarly, an output for "channel 2" consists of output 164 which corresponds with oscilloscope probe 89 (of FIG. 2). Output 166 is for "channel 3", corresponding with oscilloscope probe icon 91 (of FIG. 2). Finally, output 168 corresponds with "channel 4", from oscilloscope probe icon 93 (of FIG. 2).

"Oscilloscope" dialog box 157 includes a "display data" field 160 in which channel selection boxes 170, 172, 174, and 176 are provided. A "volts per divisions" scrolling list box 178 is provided for each channel, corresponding with a voltage scale for the ordinate, or y-axis. A second scrolling list box 180 is provided for channels 1–4 for "position" scrolling list box 180. Each channel 1–4 also includes a "Voltage" data entry field 182 in which a specific voltage value is displayed for each channel at a corresponding period in time along the abscissa, or x-axis, within display field 158. Furthermore, the "time per division" scrolling entry field 184 enables a user to adjust the time per division within signal output display field 158. Furthermore, a "time" entry field 186 displays a time corresponding with a selected time indicated by location of cursor line within display field 158 and corresponding with voltages displayed within individual data entry fields 182.

A scrolling time-line bar 188 enables a user to select a specific position along an abscissa time-line within display field 158 which then displays corresponding voltages within the entry fields 182 for channels 1–4, as well as a time within time entry field 186. Accordingly, scrolling time-line bar 188 corresponds with the abscissa, or time domain, of data field 158.

A "Grid" button 190 enables a user to turn grid lines on and off, as shown in the signal output display field 158 (of FIG. 5). A "Cursor" button 192 puts a cursor upon screen display 156 that a user can move using a mouse. "Voltage" data entry fields 182 and "Time" entry field 186 display values that correspond with data at the cursor position. A "Close" button 194 enables a user to close screen display 156.

Figure 6:
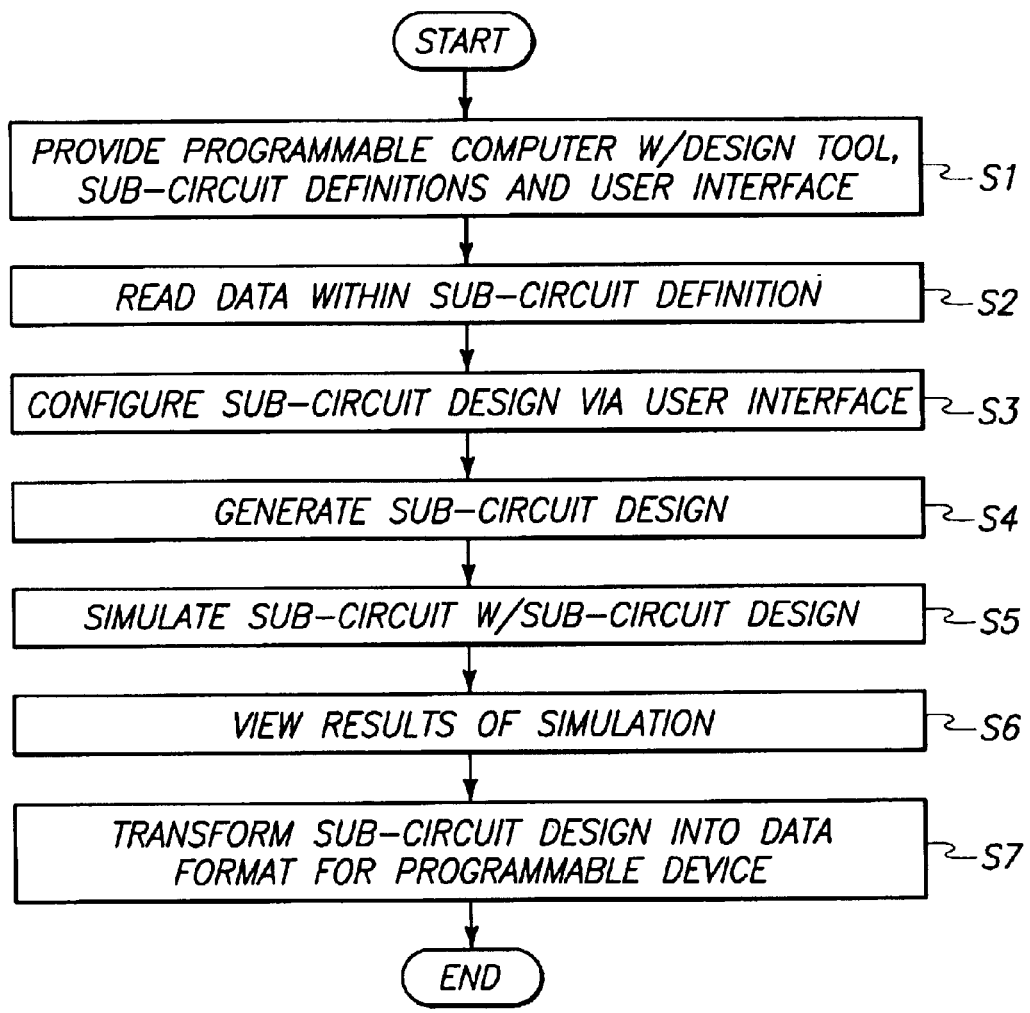
FIG. 6 is a process flow diagram showing the process stages for implementing programming of a programmable circuit device.

FIG. 6 illustrates, by way of example, one method for implementing the programming of a programmable circuit device. As shown in FIG. 6, a logic flow diagram illustrates the steps of implementing programming of a programmable circuit device, particularly a programmable circuit device having analog elements, such as a field programmable analog array (FPAA).

In Step "S1", a programmable computer is provided with a design tool, sub-circuit definitions, and a user interface. After performing Step "S1", the process proceeds to Step "S2".

In Step "S2", the step of generating a circuit design comprises reading data contained within a particular sub-circuit definition. After Step "S2", the process proceeds to Step "S3".

In Step "S3", the step of generating a circuit design includes configuring a sub-circuit design via the user interface design. After performing Step "S3", the process proceeds to Step "S4".

In Step "S4", the system generates a circuit design, or a sub-circuit design, that wires together circuit components to realize a sub-circuit within a programmable circuit device. After performing Step "S4", the process proceeds to Step "S5".

In Step "S5", via the design tool, the system is configured by a user to set up and run a simulation using a circuit design and information contained in the sub-circuit definitions. After performing Step "S5", the process proceeds to Step "S6".

In Step "S6", the process includes viewing results of a circuit simulation for the circuit design using the design tool. After performing Step "S6", the process proceeds to Step "S7".

In Step "S7", the process proceeds with transforming a circuit design, or sub-circuit design, into data properly formatted to download into a programmable device. After performing Step "S7", the process is terminated.

Figure 7:
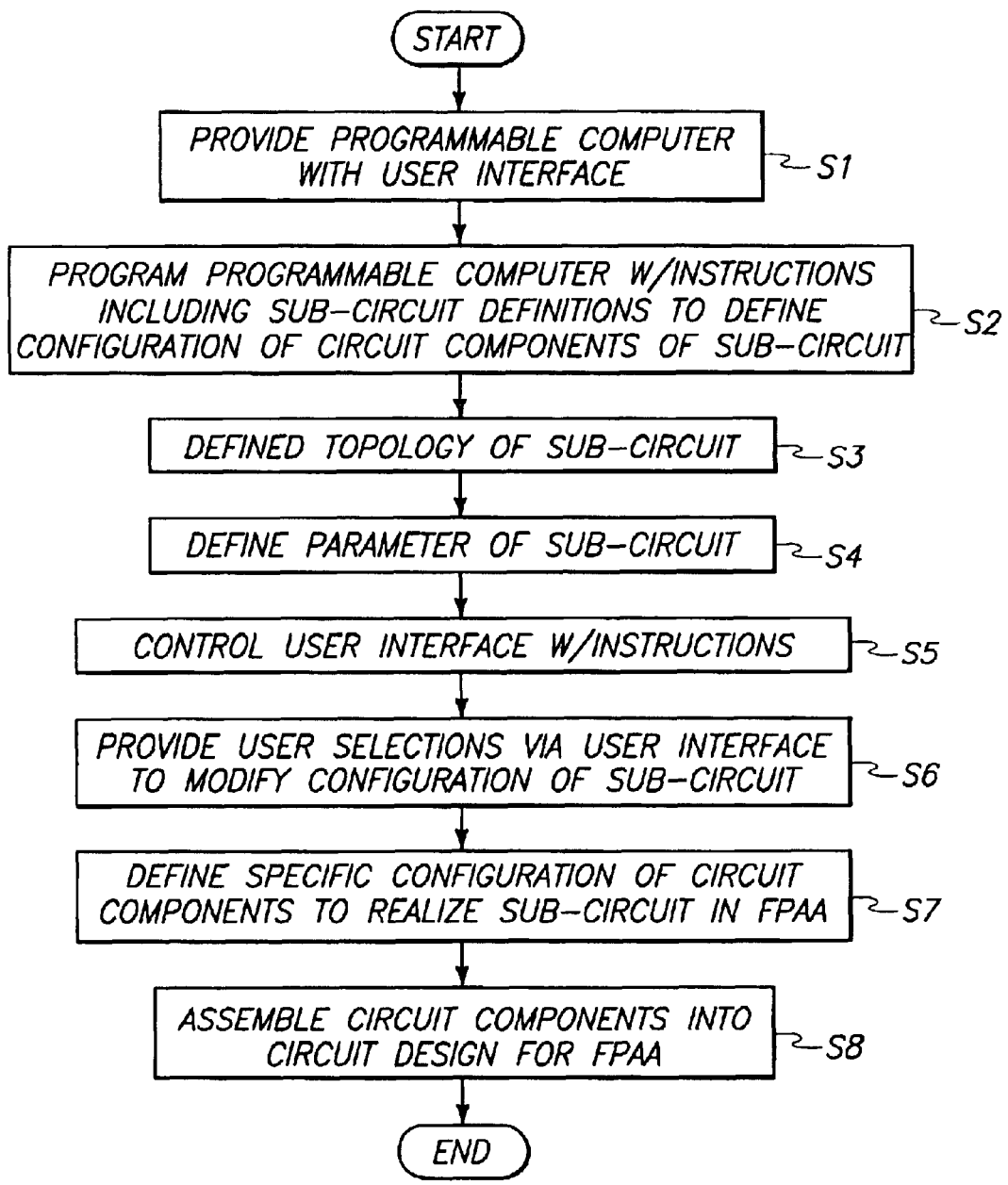
FIG. 7 is another process flow diagram showing the process stages for configuring together circuit components to enable realization of a circuit in a field programmable analog array (FPAA).

FIG. 7 illustrates, by way of example, another method for configuring together circuit components to enable realization of a circuit in a field programmable analog array (FPAA).

In Step "S1", a programmable computer is provided with a design tool, sub-circuit definitions, and a user interface. After performing Step "S1", the process proceeds to Step "S2".

In Step "S2", the process includes programming the programmable computer with instructions including sub-circuit definitions that enable a user via a user interface of the programmable computer to define a configuration of circuit components to realize a sub-circuit in the FPAA. After performing Step "S2", the process proceeds to Step "S3".

In Step "S3", the process includes defining topology of a corresponding sub-circuit. After performing Step "S3", the process proceeds to Step "S4".

In Step "S4", the process includes defining a parameter of the sub-circuit. After performing Step "S4", the process proceeds to Step "S5".

In Step "S5", the process further includes controlling the user interface with the instructions. After performing Step "S5", the process proceeds to Step "S6".

In Step "S6", the process includes providing user selections via the user interface to modify configuration of the sub-circuit. After performing Step "S6", the process proceeds to Step "S7".

In Step "S7", the process includes defining a configuration including wiring together circuit components one of a sub-circuit and a circuit. After performing Step "S7", the process proceeds to Step "S8".

In Step "S8", the process includes assembling the circuit components into a circuit design for an FPAA. After performing Step "S8", the process is terminated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An apparatus for programming a programmable device capable of realizing at least one sub-circuit by wiring together at least one circuit component, comprising:

a programmable computing device;

a design tool associated with the programmable computing device; and a self contained software agent having computer program code configured to extend capabilities to the design tool when delivered to the programmable computing device, the computer program code extending capabilities pertaining to the programmable device, defining a new sub-circuit comprising a half-cycle gain stage of the programmable device, and including at least one of multiple configurations, topologies, and parameters of the new sub-circuit of the programmable device and at least one algorithm for selecting and modifying configurations and topologies of the new sub-circuit of the programmable device according to assignment of parameters.

2. A computer program product, comprising:

a software agent having computer program code configured to extend capabilities to a design tool of a programmable computing device when delivered to the programmable computing device, the computer program code having one-to-one correspondence with a programmable device and defining a new sub-circuit of the programmable device and including at least one of multiple configurations, topologies, and parameters of the new sub-circuit of the programmable device and at least one algorithm for selecting and modifying configurations and topologies of the new sub-circuit of the programmable device according to assignment of parameters by a user of the programmable computing device, wherein the computer program code is provided in a non-executable auxiliary program.

3. The apparatus of claim 2 wherein the computer program code includes information usable to provide error checking relating to correct usage of the sub-circuit.

4. The apparatus of claim 2 wherein the computer program code includes information usable to draw a symbolic representation of the sub-circuit.

5. The apparatus of claim 2 wherein the computer program code includes information usable to simulate behavior of the sub-circuit when placed within a larger analog circuit.

6. A computer program product, comprising:

a software agent having computer program code configured to extend capabilities to a design tool of a programmable computing device when delivered to the programmable computing device, the computer program code having one-to-one correspondence with a programmable device and defining a new sub-circuit of the programmable device and including at least one of multiple configurations, topologies, and parameters of the new sub-circuit of the programmable device and at least one algorithm for selecting and modifying configurations and topologies of the new sub-circuit of the programmable device according to assignment of parameters by a user of the programmable computing device, wherein the software agent comprises a configurable analog module (CAM).

7. The computer program product of claim 6 wherein the configurable analog module (CAM) comprises a sub-circuit definition comprising information about a sub-circuit of a programmable integrated circuit usable to define multiple values for at least one parameter of the sub-circuit responsive to user input for wiring together circuit components to realize the sub-circuit in the programmable integrated circuit.

8. An apparatus for programming a programmable device, comprising:

a programmable computer;

a user interface associated with the programmable computer; and computer program code embodied in the programmable computer including at least one sub-circuit definition comprising a half cycle gain stage including information defining a sub-circuit of a programmable device usable to define multiple values for at least one parameter of the sub-circuit responsive to user input at the user interface for wiring together circuit components to realize the sub-circuit in the programmable device.

9. The apparatus of claim 8 wherein the computer program code is provided in a non-executable auxiliary program.

10. The apparatus of claim 8 wherein the at least one sub-circuit definition comprises a single text file including the information defining the sub-circuit.

11. The apparatus of claim 8 wherein the computer program code includes information for modifying a configuration of the sub-circuit.

12. The apparatus of claim 8 wherein the computer program code includes information derived from user selections implemented at the user interface.

* * * * *